US009453892B2

(12) United States Patent
Kejik et al.

(10) Patent No.: US 9,453,892 B2
(45) Date of Patent: Sep. 27, 2016

(54) HALL SENSOR SYSTEM

(75) Inventors: Pavel Kejik, Ecublens (CH); Serge Reymond, Geneva (CH)

(73) Assignee: LEM Intellectual Property SA, Fribourg (CH)

( * ) Notice: Subject to any disclaimer, the term of this patent is extended or adjusted under 35 U.S.C. 154(b) by 818 days.

(21) Appl. No.: 13/806,638

(22) PCT Filed: Jul. 1, 2011

(86) PCT No.: PCT/IB2011/052911
§ 371 (c)(1),
(2), (4) Date: Dec. 21, 2012

(87) PCT Pub. No.: WO2012/001662
PCT Pub. Date: Jan. 5, 2012

(65) Prior Publication Data
US 2013/0099782 A1   Apr. 25, 2013

(30) Foreign Application Priority Data
Jul. 2, 2010   (EP) .................... 10168375

(51) Int. Cl.
G01R 33/07   (2006.01)
H01L 43/06   (2006.01)
G01R 33/00   (2006.01)

(52) U.S. Cl.
CPC ........... G01R 33/07 (2013.01); G01R 33/0005 (2013.01); G01R 33/075 (2013.01); H01L 43/065 (2013.01)

(58) Field of Classification Search
CPC ........... G01R 33/0005; G01R 15/202; G01D 5/145; G01D 5/147; H01L 43/065
See application file for complete search history.

(56) References Cited

U.S. PATENT DOCUMENTS

| 5,844,427 A * | 12/1998 | Theus ..................... G01D 5/142 324/251 |
| 6,674,280 B1 * | 1/2004 | Goetz ..................... G01B 7/003 324/207.12 |
| 6,720,761 B1 * | 4/2004 | Doi ........................ G01R 33/07 324/207.2 |

(Continued)

FOREIGN PATENT DOCUMENTS

| JP | 02216479 | 8/1990 |
| JP | H0384484 A | 4/1991 |
| WO | WO2009052537 A1 | 4/2009 |

OTHER PUBLICATIONS

International Preliminary Report on Patentablity issued the The International Bureau of WIPO, Geneva, Switzerland, dated Jan. 8, 2013, for International Application No. PCT/IB2011/052911; 16 pages.

(Continued)

Primary Examiner — Jermele M Hollington
Assistant Examiner — Dustin Dickinson
(74) Attorney, Agent, or Firm — Faegre Baker Daniels LLP

(57) ABSTRACT

Integrated circuit Hall sensor system comprising a plurality of elementary blocks (EB), each elementary block including a Hall cell (4), a differential pair (8) of an input stage of a Differential Difference Amplifier (DDA), and terminals (12a, 12b), wherein the terminals (12a, 12b) are placed laterally on opposing outer sides of each elementary block parallel to a Y axis and the plurality of elementary blocks are arranged in a juxtaposed manner to form at least one row (6a, 6b) extending along an X axis orthogonal to the Y axis and interconnected by the terminals.

23 Claims, 5 Drawing Sheets

(56) References Cited

U.S. PATENT DOCUMENTS

| | | | |
|---|---|---|---|
| 2005/0127899 A1* | 6/2005 | Kakuta | G01D 5/14 324/207.2 |
| 2007/0029999 A1 | 2/2007 | Middelhoek et al. | |
| 2007/0247141 A1 | 10/2007 | Pastre et al. | |
| 2010/0145657 A1 | 6/2010 | Kavusi et al. | |
| 2010/0164483 A1* | 7/2010 | Namai | G01R 33/07 324/207.2 |
| 2011/0133723 A1* | 6/2011 | Forsyth | G01D 5/145 324/207.2 |

OTHER PUBLICATIONS

Pastre M. et al., "A Hall Sensor Analog Front End for Current Measurement with Continuous Gain Calibration," Solid-State Circuits Conference, 2005. Digest of Technical Papers. ISS CC; 2005 IEEE International San Francisco, CA, USA, Feb. 6-10, 2005; IEEE, Piscataway, NJ, USA; LNKD-DOI:10.1109/ISSCC.2005. 1493959, Jan. 1, 2005; pp. 242, 243, and 596. vol. 1, XP031173736; ISBN: 978-0-7803-8904-5.

International Search Report and Written Opinion issued by the European Patent Office, dated Aug. 26, 2011, for related International Application No. PCT/IB2011/052911; 16 pages.

Munter, P., "A Low-Offset Spinning-Current Hall Plate", Sensors and Actuators, A21-A23 (1990); pp. 743-746.

Popovic, R., et al., "Nonlinearity in Hall Devices and its Compensation", Solid-State Electronics, vol. 31, No. 12, 1988; pp. 1681-1688.

Alzaher, Hussain, et al., "A CMOS Fully Balanced Differential Difference Amplifier and its Applications", IEEE Transactions on Circuits and Systems—II: Analog and Digital Signal Processing, vol. 48, No. 6, Jun. 2001; pp. 614-620.

Sample, H., "Reverse-field reciprocity for conducting specimens in magnetic fields", J. Appl. Phys. 61 (3), Feb. 1, 1987, American Institute of Physics; pp. 1079-1084.

* cited by examiner

HALL SENSOR SYSTEM

The present invention relates to a Hall sensor system for magnetic field sensing applications or for current sensing applications.

For numerous applications, Hall effect sensors integrated in silicon circuits are preferred over other magnetic field sensors because they can be entirely fabricated by a standard CMOS or other integrated circuit manufacturing processes that are economical for large series production. A drawback of conventional integrated Hall effect devices however is that they have a relatively large residual offset i.e. residual voltage at zero magnetic field. What limits the residual offset is the device non-linearity due to the dependence of local resistance in the Hall sensor on the current density. According to the reverse field reciprocity principle [3], the spinning current method would cancel the offset in a linear system. As the system becomes non-linear, the efficiency of the spinning current method decreases, and therefore a residual offset remains. A major cause of non-linearity is either the junction field effect [4] or the carrier velocity saturation, depending on the device geometry. In both cases the non-linearity increases with the device bias voltage. Techniques such as spinning current [1] or orthogonal coupling are known to reduce the offset down to the 100 µT range.

In order to gain an advantage over competing technologies, the offset of integrated Hall sensors should however be reduced further, for instance to the 10 µT range.

An object of this invention is to provide a magnetic field sensor system that is accurate, and in particular has a low offset. It would be advantageous to provide a magnetic field sensor system that is economical to manufacture in large series.

It would be advantageous to provide a magnetic field sensor that is compact and reliable.

Objects of this invention have been achieved by providing the Hall sensor system according to claim 1.

Objects of this invention have been achieved by providing the Hall sensor system according to claim 4.

Dependent claims describe further advantageous features of the Hall sensor system according to the invention.

Disclosed herein is an integrated circuit Hall sensor system comprising a plurality of elementary blocks (EB), each elementary block including a Hall cell, an input stage of an amplifier, and terminals, wherein the terminals are placed laterally on opposing outer sides of each elementary block and the plurality of elementary blocks are arranged in a juxtaposed manner to form at least one row interconnected by the terminals. Each elementary block may advantageously further include a current source, and a four phase switch box connected to the Hall cell.

In an advantageous embodiment, the input stage may comprise or consist in a differential pair and the amplifier may comprise or consist in a Differential Difference Amplifier (DDA).

The Hall cells in each row may be connected and configured to operate in parallel.

In an advantageous embodiment, there are at least two rows of elementary blocks arranged in mirror image symmetry. Each row of elementary blocks may be terminated by a second stage of the amplifier to form a front-end channel. Each channel may further comprise a demodulator and an output buffer.

Further objects and advantageous features of the invention will be apparent from the claims and the following detailed description of embodiments of the invention in relation to the annexed drawings in which:

FIG. 3a is a block diagram and FIG. 3b a schematic circuit diagram

Figure 5:
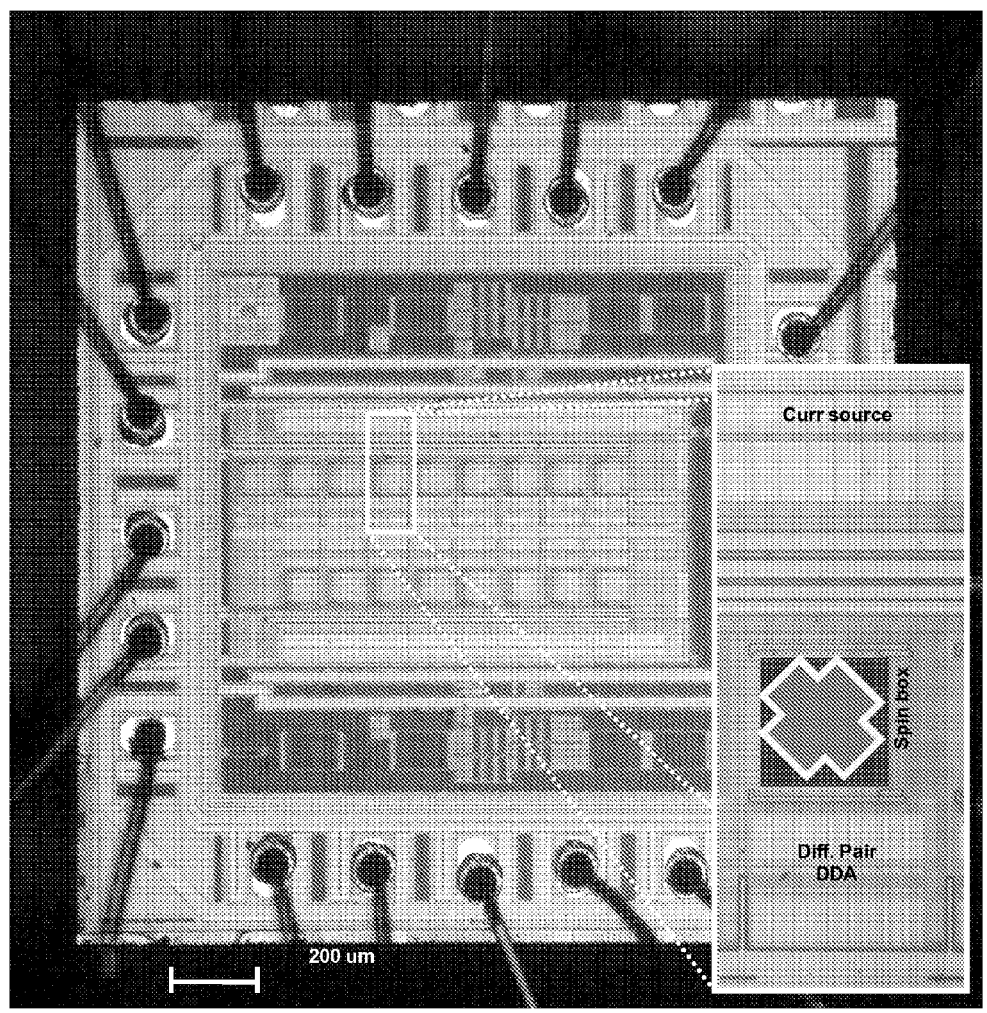
FIG. 5 is a photograph of an example of an experimental setup of a Hall sensor system mounted on a PCB according to the invention.
Figure 6:
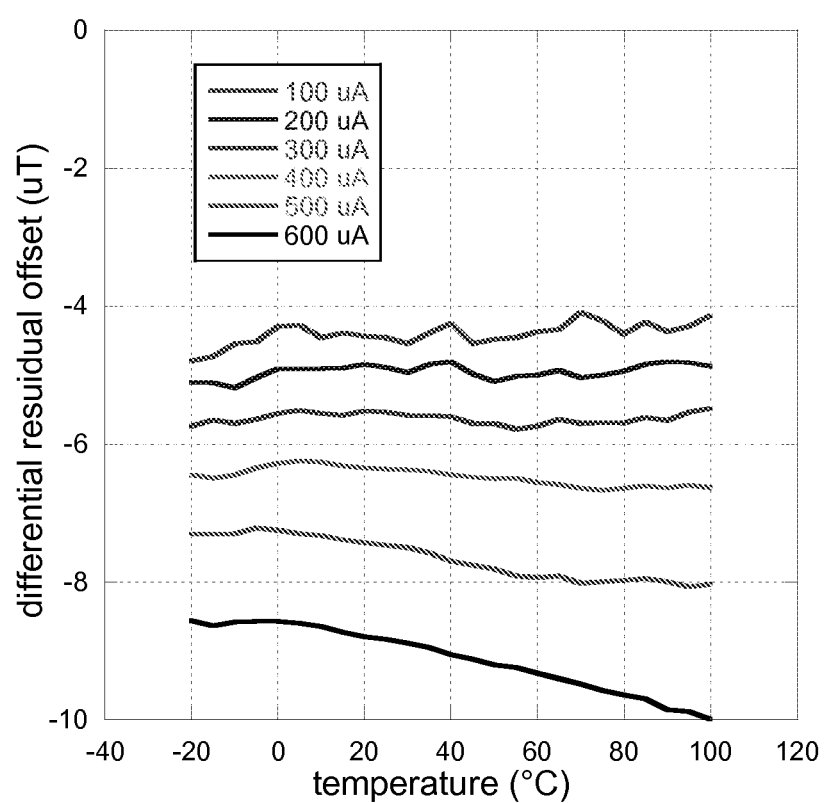

FIG. 6 is a graph of differential residual offset drift in temperature for the experimental setup of FIG. 5, whereby the Hall cell bias current was swept from 100 uA to 600 uA, and a difference at the outputs of the front-end channel 1 and channel 2 was measured for each temperature step.

Figure 1:
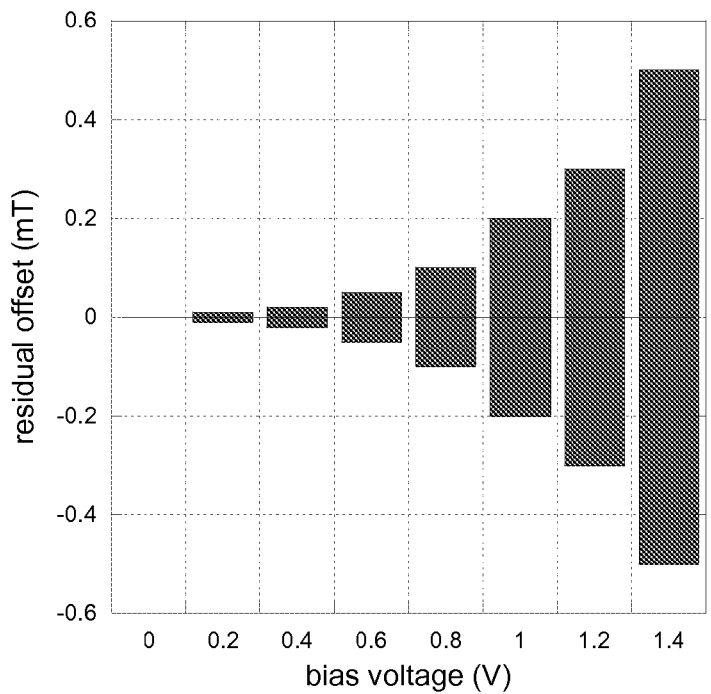
FIG. 1 is a graph showing typical residual offset as a function of the bias voltage applied on an integrated Hall cell.

In the design of an integrated Hall cell with low offset and offset drift, one objective is to keep the bias voltage low. Typical offset values, as function of the voltage applied on a cross-shaped CMOS integrated Hall cell are shown in FIG. 1, where the residual voltage is divided by the sensitivity to be expressed in magnetic field units. The residual offset was obtained after applying four-phase spinning current method at zero magnetic field. FIG. 1 illustrates that it is important to keep the bias voltage low, however reducing the bias voltage degrades the signal-to-noise ratio because thermal noise then dominates.

Figure 2:
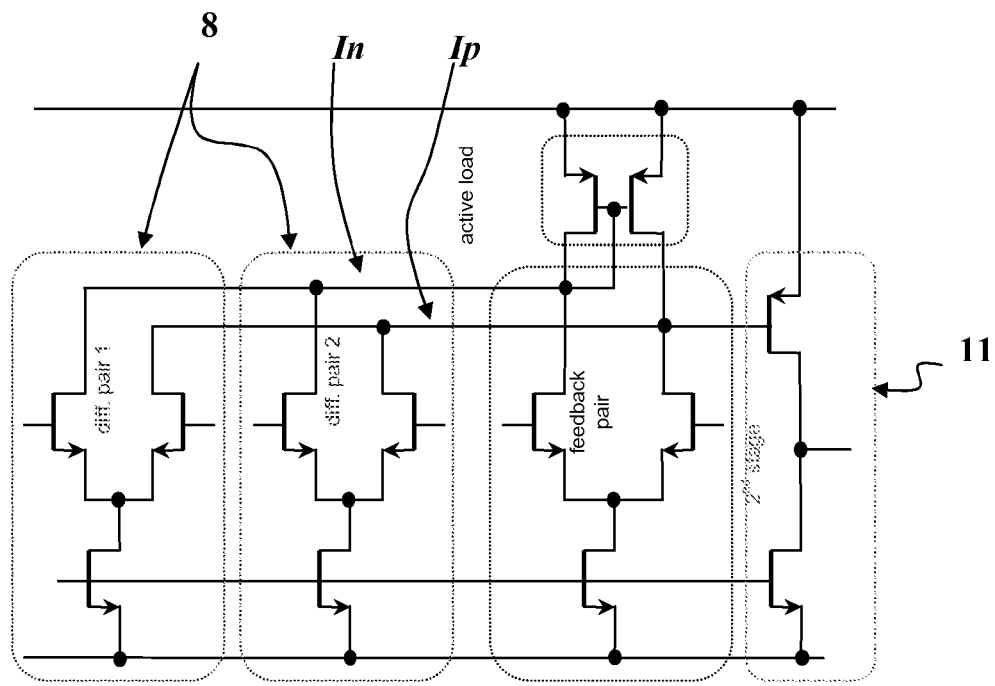
FIG. 2 is a schematic diagram of a DDA topology with differential signal connections In, Ip according to a feature of an embodiment of the invention.

According to the invention, the signal-to-noise ratio is significantly improved by integrating an array of Hall cells, each one weakly biased. The array is advantageously scalable and easy to integrate without layout limitations. In a preferred embodiment, the array comprises a Differential Difference Amplifier (DDA) topology (see reference [5] for a description of DDA design), offering flexibility in choosing the number of differential pairs 8 connected to common signal connections In, Ip of the DDA as illustrated in FIG. 2. The number of differential pairs can be increased by connecting other differential pairs in parallel to the common signal connections In, Ip.

In an embodiment of the present invention, the differential sensing of the Hall voltage based on the DDA is preferred. Nevertheless, within the scope of the invention it is possible to adopt other amplification means, whereby the choice of the biasing method may affect the structure and performance of the first signal-amplifying stage. If an operational amplifier (OA) is used, the circuit for Hall bias current could for instance be rearranged according to [6] and corresponding input stage incorporated in the elementary block.

Figure 3:
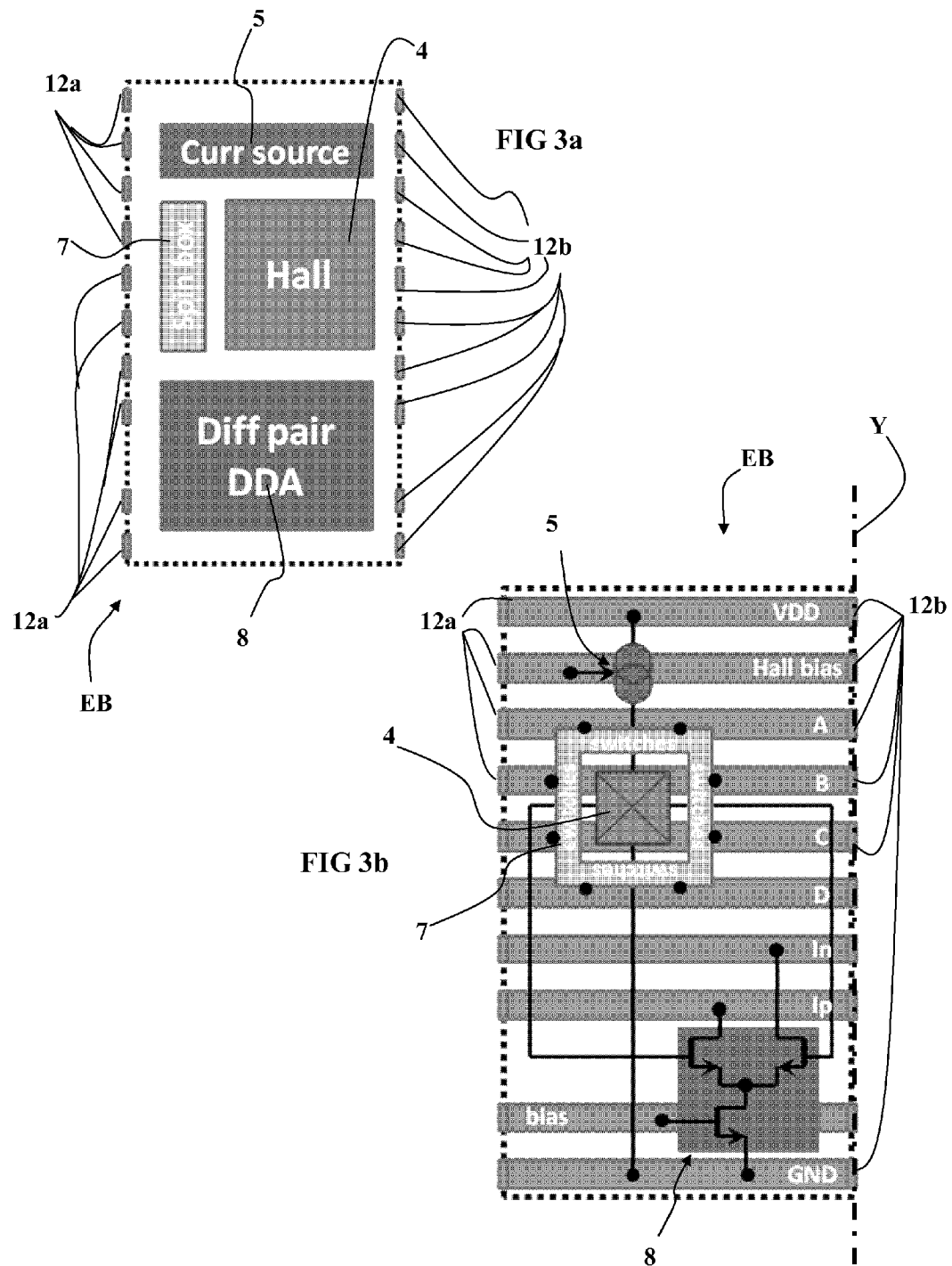
FIGS. 3a and 3b illustrate an elementary block (EB) forming a building unit for distributed Hall cell array of a sensor system according to an embodiment of the invention, where

For a simple Hall cell array realization, the number of differential pairs of the DDA can be arbitrarily increased and wired to Hall cells. However when reaching certain number of differential pairs, the floor plan becomes complicated. In addition, if all routing lines converge to an off-centered DDA block, the layout symmetry is broken. According to an advantageous aspect of the invention, each Hall cell is associated with a bias circuit and a part of an amplification stage that allows a parallel connection. These elements are part of an elementary block (EB), as shown in FIGS. 3a and 3b.

More precisely, the elementary block EB according to an advantageous embodiment of the invention comprises a Hall device 4, a switch box (also called spin box) 7, a current source 5 and an input stage 8 of an amplifier. In the embodiment illustrated, the input stage comprises a differential pair 8 of a Differential Difference amplifier (DDA). The switchbox 7 is driven by logic signals from a logic circuit 9a, 9b input through connections A, B, C and D of the EB to perform four-phase spinning current. The differential pair 8 advantageously converts the Hall sensing voltage to a current signal that is easy to read. The EB terminals 12 are placed laterally and symmetrically along a Y axis, to easily build up a row 6a, 6b containing a number N of elementary blocks EB interconnected by the adjacent opposing terminals 12a, 12b of adjacent elementary blocks. The Hall cells 4 in each row 6a, 6b operate in parallel. Since the Hall signals of each Hall cell are correlated, the sum of currents of each elementary block represents the useful measurement signal, whereas the intrinsic offsets of Hall cells 4 are uncorrelated and averaged over the number of elementary blocks N. The current signal is reconverted into a voltage in the $2^{nd}$ stage 11a, 11b of the DDA, which terminates each row 6a, 6b. Each complete row 6a, 6b with its DDA $2^{nd}$ stage block 11a, 11b forms one front-end channel.

Figure 4:
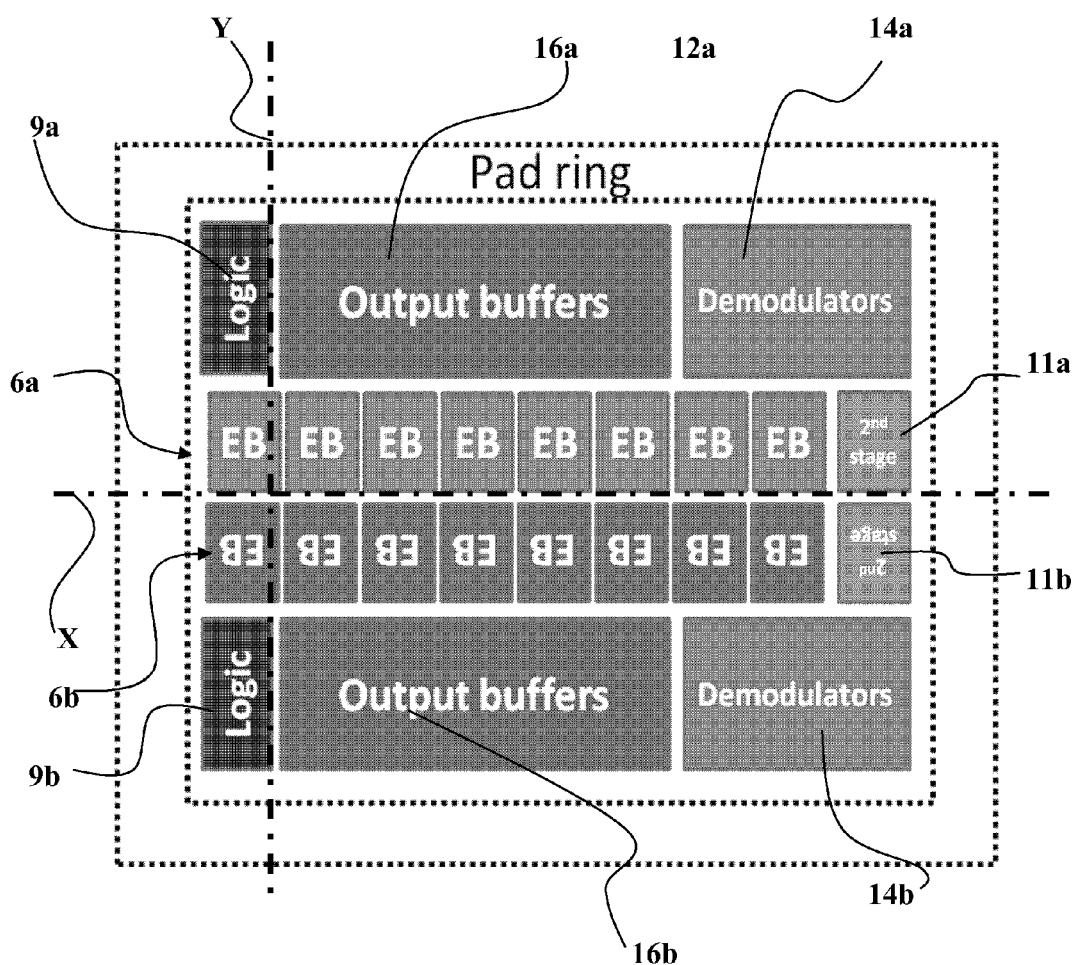
FIG. 4 is a floorplan of a two channel integrated Hall sensor system according to an embodiment of the invention.

As depicted in FIG. 4, the front-end channel can be replicated by mirroring along an X axis, orthogonal to the Y axis, in order to realize two rows 6a, 6b of elementary blocks EB in mirror symmetry, in order to obtain a differential output and suppress undesirable systematic offsets generated by the electronics.

Hence, the topology of the system is "distributed" and symmetrical with respect to one centre-line axis X. This architecture allows finding a good trade-off between offset reduction, sensitivity and current consumption. In the embodiment illustrated, the system is completed by conditioning circuits 9a, 9b that provide inter alia the spin box logic signals A, B, C, D, demodulators 14 based on switched-capacitor circuit, and output buffers 16, for each channel to obtain a stand-alone magnetic field micro-sensor. The back-end circuit may be similar to a conventional circuit, for instance as described in [7].

Experimental Setup

Example ff Chip Realization

An experimental system in 0.35 um CMOS standard technology was built of 16 EB's, equally distributed in the central part of the layout as shown by the photograph of the chip in FIG. 5. The Hall signal was processed in a differential way and monitored in modulated form at the output of each DDA, or demodulated using switched capacitor technique with variable clock frequency, depending on the required signal bandwidth. The logic circuit was either driven by the internal clock: a 2.6 MHz RC relaxation oscillator with frequency dividers, or externally controlled. The circuit was tested from the kHz range up to 1.3 MHz of modulation frequency. The bias current of Hall cells can be externally controlled by a current source for testing purposes. The layout size was of 1.6×1.6 mm2. The third EB of the upper row is zoomed out and the Hall device location is schematized by a cross shape. The total current consumption depends on the value of the Hall cell bias current: when applying 500 uA on each Hall cell, the overall current consumption was of 25 mA at 3.3 V supply voltage.

To study the residual offset behavior and its origin in the system, the experimental setup was used where the temperature and the Hall cell bias current can be swept. A 6-layer permalloy magnetic shielding was used to protect the system from environmental noise and suppress the external magnetic field. The tests were performed on three randomly selected samples. The differential offset between the channels was monitored (this is the final offset of the system), but also the individual offset of each channel. The system sensitivity depends on Hall cell bias current, for instance with a 500 uA bias current per Hall cell, the measured overall sensitivity was 21 V/T.

Characterization of Front-end Part

When realizing a low offset system it is important to know the offset origin in the system. For this purpose the modulated signal at the output of the DDA was monitored and demodulated with an external lock-in amplifier, synchronized by a logic signal coming from the system. A relatively low modulation frequency of 5 kHz was selected to neglect the settling time of the DDA and the spikes generated by switches. The Hall bias current was swept from 100 uA to 600 uA for each temperature step. Since the Hall voltage is modulated at the input of the DDA, the residual Hall offset can be separated from the DDA offset by the demodulation and extracted from the measurement. The offset drift was measured in a temperature range from −20 to 100° C. FIG. 6 shows the differential offset drift for various Hall bias current measured on the experimental setup. For bias currents less than 200 uA, the offset drift is hidden by the noise. For Hall bias currents higher than 300 uA, the offset drift shows an increase similar to the behavior shown in FIG. 1, although at a much lower level.

REFERENCES

[1] P. Munter, "A low-offset spinning-current Hall plate", Sensors and Actuators A: Physical, 21-23 (1990) 743-746
[2] P. Ripka, "Magnetic Sensors and Magnetometers", ISBN 1 58053 057 5, 2001
[3] H H. Sample et al. "Reverse field reciprocity for conducting specimens in magnetic fields" J. Appl. Phys. 61, (1987) 1079
[4] R. S. Popović, B. Hälg, "Nonlinearity in Hall devices and its compensation", Solid-State Electronics, Volume 31, Issue 12, Dec. 1988, 1681-1688
[5] H Alzaher, M Ismail, "A CMOS Fully Balanced Differential Difference Amplifier and Its Applications", IEEE TRANSACTIONS ON CIRCUITS AND SYSTEMS-II: ANALOG AND DIGITAL SIGNAL PROCESSING, VOL. 48, NO. 6, Jun. 2001, pp. 614-620
[6] R. S. Popovic, "Hall Effect Devices", the adam hilger series on sensors, ISBN: 0-7503-0096-5, 1991, pp. 187-188

The invention claimed is:

1. Integrated circuit Hall sensor system comprising a plurality of elementary blocks (EB), each elementary block including a Hall cell, a switch box connected to the Hall cell, an input stage of an amplifier, the input stage comprising at least one transistor, and terminals, wherein the terminals are placed laterally on opposing outer sides of each elementary block parallel to a Y axis and the plurality of elementary blocks are arranged in a juxtaposed manner to form at least one row extending along an X axis orthogonal to the Y axis and interconnected by the terminals.

2. Integrated circuit Hall sensor system according to claim 1, wherein said switch box connected to the Hall cell is a four phase switch box.

3. Integrated circuit Hall sensor system according to claim 1, wherein each row of elementary blocks is terminated by a second stage of said amplifier, forming a front-end channel.

4. Integrated circuit Hall sensor system according to claim 3, wherein each channel comprises a logic circuit connected through connections (A, B, C, D) of the elementary blocks configured to deliver logic signals to a four phase current switch box of each elementary block connected to the Hall cell to perform four-phase spinning current on each Hall cell.

5. Integrated circuit Hall sensor system according to claim 3, wherein each channel comprises a demodulator based on a switched-capacitor circuit.

6. Integrated circuit Hall sensor system according to claim 3, wherein each channel comprises an output buffer.

7. Integrated circuit Hall sensor system according to 1, wherein the input stage is a differential pair.

8. Integrated circuit Hall sensor system according to claim 1, wherein the amplifier is a Differential Difference Amplifier (DDA).

9. Integrated circuit Hall sensor system according to claim 8, wherein a second stage of the DDA is configured to convert a current signal output of the elementary blocks into a voltage signal.

10. Integrated circuit Hall sensor system according to claim 1, wherein each elementary block further includes a current source.

11. Integrated circuit Hall sensor system according to claim 1, wherein the Hall cells in said at least one row are connected and configured to operate in parallel.

12. Integrated circuit Hall sensor system according to claim 1, wherein there are at least two said rows of elementary blocks arranged in mirror image symmetry about the X axis.

13. Integrated circuit Hall sensor system comprising a plurality of elementary blocks, each elementary block including a Hall cell, an input stage of an amplifier, the input stage comprising at least one transistor, and terminals, wherein the terminals are placed laterally on opposing outer sides of each elementary block parallel to a Y axis and the plurality of elementary blocks are arranged in a juxtaposed manner to form at least one row extending along an X axis orthogonal to the Y axis and interconnected by the terminals, and wherein each row of elementary blocks is terminated by a second stage of the said amplifier, forming a front-end channel.

14. Integrated circuit Hall sensor system according to claim 13, wherein each elementary block further includes a four phase switch box connected to the Hall cell.

15. Integrated circuit Hall sensor system according to claim 13, wherein each channel comprises a logic circuit connected through connections (A, B, C, D) of the elementary blocks configured to deliver logic signals to a four phase current switch box of each elementary block connected to the Hall cell to perform four-phase spinning current on each Hall cell.

16. Integrated circuit Hall sensor system according to claim 13, wherein each channel comprises a demodulator based on a switched-capacitor circuit.

17. Integrated circuit Hall sensor system according to claim 13, wherein each channel comprises an output buffer.

18. Integrated circuit Hall sensor system according to 13, wherein the input stage is a differential pair.

19. Integrated circuit Hall sensor system according to claim 13, wherein the amplifier is a Differential Difference Amplifier (DDA).

20. Integrated circuit Hall sensor system according to claim 19, wherein the second stage of the DDA is configured to convert a current signal output of the elementary blocks into a voltage signal.

21. Integrated circuit Hall sensor system according to claim 13, wherein each elementary block further includes a current source.

22. Integrated circuit Hall sensor system according to claim 13, wherein the Hall cells in said at least one row are connected and configured to operate in parallel.

23. Integrated circuit Hall sensor system according to claim 13, wherein there are at least two said rows of elementary blocks arranged in mirror image symmetry about the X axis.

* * * * *